(12) United States Patent
Ishihara

(10) Patent No.: US 10,965,255 B1
(45) Date of Patent: Mar. 30, 2021

(54) OVERVOLTAGE PROTECTION FOR POWER AMPLIFIER WITH SOFT SHUTDOWN

(71) Applicant: pSemi Corporation, San Diego, CA (US)

(72) Inventor: Shota Ishihara, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 16/669,384

(22) Filed: Oct. 30, 2019

(51) Int. Cl.
| | | |
|---|---|---|
| H03F 1/30 | (2006.01) |
| H03F 3/21 | (2006.01) |
| H03F 1/02 | (2006.01) |
| H03F 1/56 | (2006.01) |

(52) U.S. Cl.
CPC .......... H03F 1/302 (2013.01); H03F 1/0211 (2013.01); H03F 3/211 (2013.01); *H03F 1/56* (2013.01); *H03F 2200/222* (2013.01); *H03F 2200/318* (2013.01); *H03F 2200/387* (2013.01); *H03F 2200/451* (2013.01)

(58) Field of Classification Search
CPC ..................................................... H03F 1/302
See application file for complete search history.

(56) References Cited

U.S. PATENT DOCUMENTS

| | | | | |
|---|---|---|---|---|
| 6,166,530 | A * | 12/2000 | D'Angelo | ............... G05F 3/242 |
| | | | | 323/273 |
| 6,525,611 | B1 | 2/2003 | Dening et al. | |
| 8,487,705 | B2 | 7/2013 | Yao et al. | |
| 9,413,298 | B2 | 8/2016 | Nobbe et al. | |
| 9,876,478 | B2 * | 1/2018 | Modi | .................... H03F 1/0222 |
| 10,153,737 | B2 | 12/2018 | Ishihara et al. | |
| 2006/0197594 | A1 | 9/2006 | Scuderi et al. | |
| 2011/0221533 | A1* | 9/2011 | Lesso | .................... H03F 1/0227 |
| | | | | 330/297 |

(Continued)

FOREIGN PATENT DOCUMENTS

WO 2003-030328 A1 4/2003

OTHER PUBLICATIONS

International Search Report and Written Opinion for PCT App. No. PCT/US2020/057171 filed Oct. 23, 2020 on behalf of PSEMI Corporation. dated Feb. 10, 2021. 9 pages.

*Primary Examiner* — Patricia T Nguyen
(74) *Attorney, Agent, or Firm* — Steinfl + Bruno LLP

(57) ABSTRACT

Various methods and circuital arrangements for protection of a power amplifier from over voltage are presented. According to one aspect, a protection circuit coupled to a varying supply voltage of the power amplifier controls a biasing current to the power amplifier to limit a power dissipation through the power amplifier. An overvoltage protection circuit detects a level of the varying supply voltage and decreases the biasing current as a linear function of an increasing supply voltage once the supply voltage reaches a programmable voltage level. A slope of the linear function can be made programmable. Programmability of the voltage level and the slope can be used to control biasing currents to a plurality of power amplifiers operating at different times and having different requirements in terms of voltage limits and thermal breakdown. According to another aspect a voltage to current converter for use in the overvoltage protection circuit is presented.

26 Claims, 14 Drawing Sheets

(56) References Cited

U.S. PATENT DOCUMENTS

| | | | |
|---|---|---|---|
| 2011/0279185 A1* | 11/2011 | Lautzenhiser | H03F 1/301 |
| | | | 330/296 |
| 2015/0333711 A1* | 11/2015 | Langer | H03F 3/21 |
| | | | 455/127.2 |
| 2016/0072452 A1 | 3/2016 | Ripley et al. | |
| 2019/0348959 A1* | 11/2019 | Lasser | H03F 1/0205 |

\* cited by examiner

OVERVOLTAGE PROTECTION FOR POWER AMPLIFIER WITH SOFT SHUTDOWN

CROSS REFERENCE TO RELATED APPLICATIONS

The present application is related to U.S. Pat. No. 10,153,737 B2 entitled "Power Amplifier Module" issued Dec. 11, 2018, the disclosure of which is incorporated herein by reference in its entirety. The present application may also be related to U.S. Pat. No. 9,413,298 entitled "Amplifiers Operating in Envelope Tracking Mode" issued Aug. 9, 2016, the disclosure of which is incorporated herein by reference in its entirety

TECHNICAL FIELD

The present application relates to amplifiers. In particular, the present application relates to overvoltage protection of power amplifiers (PAs) that operate from a varying supply voltage.

BACKGROUND

FIG. 1A shows a prior art radio frequency (RF) power amplifier (PA) module (110) which can be used, for example, in a transmitter section of an RF front-end communication system, such as for example, a mobile communication system. As shown in FIG. 1A, the power amplifier module (110) can include a number of cascaded amplifier stages (e.g., 112, 113), coupled in series connection via matching networks (e.g., MN1, MN2, MN3), for amplification of an input RF signal, RFin, to generate therefrom an amplified output RF signal, RFout. Power to the amplifier stages (112, 113) is provided via a supply voltage, Vcc, that is referenced to a reference ground, Vgnd, the supply voltage coupled to the amplifier stages (112, 113) through respective inductors (L2, L3). The amplified signal, RFout, can in turn be transmitted via, for example, an antenna that is coupled to the PA module through an antenna switch (e.g., elements 740 and 750 per FIG. 7 later described).

As shown in FIG. 1A, an input stage of each of the amplifier stages (112, 113) may include a respective common-emitter transistor (Tr12, Tr13) whose base receives the input RF signal which is amplified by the common-emitter transistor (Tr21, Tr13) and output at a respective collector of the transistor (e.g., details in lower right corner of the figure), the collector being coupled to the supply voltage, Vcc, through a respective inductor (L2, L3), and coupled to a respective output of the amplifier stages (112, 113). Amplification through each of the amplifier stages (112, 113), and therefore through the PA module (110), may be based on biasing of the amplifier stages (112, 113) to establish operating points (i.e., bias points) of the common-emitter transistors (Tr12, Tr13). As can be seen in FIG. 1A, such biasing is provided via a biasing circuit (120) that includes emitter-follower transistors (Tr22, Tr23) coupled to respective inputs of the amplifier stages (112, 113). The emitter of each of the emitter-follower transistors (Tr22, Tr23) is coupled to a base of a respective common-emitter transistor (Tr21, Tr23) through a series connected resistor (R12, R13) that is known in the art as a "ballast" resistor. Accordingly, the biasing circuit (120) provides a biasing signal, that can be considered as a biasing voltage or a biasing current, to each of the amplification stages (112, 113).

With continued reference to FIG. 1A, the biasing circuit (120) may generate the biasing signals under control of a controller circuit (130) that may include a control/interface circuit (132) to receive commands from, for example, a signal aware processor, such as, for example, a transceiver circuit, and translate such commands to control signals to generate corresponding biasing signals for biasing of the PA module (110). In the exemplary prior art case shown in FIG. 1A, a digital-to-analog (DAC) converter (135) is used to generate the control signals (i.e., currents or voltages) to the emitter-follower transistors (Tr22, Tr23) of the biasing circuit (120). For example, as shown in FIG. 1A, the DAC converter (135) may provide a voltage to the base of each of the emitter-follower transistors (Tr22, Tr23) so that a desired biasing signal can be output at the emitter of each such transistor for biasing of the PA module (110). As described, for example, in the above referenced U.S. Pat. No. 10,153,737 B2, series connected diodes pairs (D21, D22) and (D31, D32) coupled between the reference ground, Vgnd, and base of respective emitter-follower transistors (Tr22, Tr23) can be used to counter thermal variation of the common-emitter transistors (Tr12, Tr13) and prevent, in some cases, thermal runaway as known in the art, of the common-emitter transistors (Tr12, Tr13), assuming a constant supply voltage Vcc. However, assuming a varying supply voltage, Vcc, for increasing values of the supply voltage, Vcc, with respect to a nominal value, biasing points of the common-emitter transistors (Tr12, Tr13) may change such to enable higher (collector) currents (Icc2, Icc3) through such common-emitter transistors. Because a base current (Ib2, Ib3) provided by the emitter-follower transistors (Tr22, Tr23) via a constant voltage supply (e.g., Vbatt) is not limited, the higher (collector) currents (Icc2, Icc3) can be enabled by higher base currents (Ib2, Ib3) which in combination with the increasing supply voltage, Vcc, can cause thermal damage of the common-emitter transistors (Tr12, Tr13). A corresponding curve of power (heat) dissipation through the common-emitter transistors (Tr12, Tr13) as a function of the supply voltage, Vcc, is shown in FIG. 1B, where the power dissipation (annotated as Pheat in the figure) is the product of a value of the supply voltage, Vcc, and a value of the collector current (Icc, e.g., Icc2, Icc3 of FIG. 1A). Because the collector current (Icc2, Icc3) can increase linearly with respect to the increasing value of the supply voltage, Vcc, the curve shown in FIG. 1B is based on a quadratic function, which can therefore provide a rapid increase of the power dissipation to reach a thermal breakdown limit (e.g., for Vcc=Vcc_bd1) where the common-emitter transistors (Tr21, Tr22) may become nonoperational.

As described in the above referenced U.S. Pat. No. 10,153,737 B2, the prior art configuration shown in FIG. 2A limits the base current (Ib2, Ib3) by supplying a limited current, $I_{OUT\_OCP}$, to the collector of the emitter-follower transistors (Tr22, Tr23) of the biasing circuit (120). As shown in FIG. 2A, this can be provided by an over current protection (OCP) circuit (235), shown in FIG. 2A as part of a controller circuit (230), that can be controlled, via for example, the control/interface circuit (132), to set a higher limit of the current $I_{OUT\_OCP}$, output by the OCP circuit (235). As the supply voltage, Vcc, increases, the collector currents (Icc2, Icc3) may increase up to a limit set by the current $I_{OUT\_OCP}$ used by the emitter-follower transistors (Tr22, Tr23) to generate the bias currents (Ib2, Ib3). Once the limit of the current $I_{OUT\_OCP}$ is reached, no further increase of the base currents (Ib2, Ib3) for higher collector currents (Icc2, Icc3) responsive to further increase of the supply voltage, Vcc, can be provided. However, as the supply voltage, Vcc, may further increase, power dissipation in the common-emitter transistors (Tr12, Tr13) may still increase linearly with respect to the supply voltage, Vcc. This is shown in the power (heat) dissipation curve of FIG. 2B, wherein as the supply voltage, Vcc, increases from lower values to higher values, the power dissipation (annotated as Pheat in the figure) increases as a quadratic function up to a point (e.g., Vcc=Vcc_lm) where the collector current (annotated as Icc in the figure) saturates due to the limit imposed on the base currents (Ib2, Ib3), after which the power dissipation increases as a linear function of the supply voltage, Vcc, until the thermal breakdown limit (e.g., for Vcc=Vcc_bd2) is reached. Accordingly, when compared to the prior art configuration shown in FIG. 1A, the OCP circuit (235) of the prior art configuration shown in FIG. 2A can allow for a larger headroom in variation of the supply voltage, Vcc, from a nominal value prior to thermal breakdown of the common-emitter transistors (Tr21, Tr22). It should be noted that the curves shown in FIGS. 1B and 2B can be applied to power dissipation in each of the common-emitter transistors (Tr21, Tr22), further scaled in view of possible different sizes of each such transistor.

Well known in the art RF amplification schemes, such as for example, envelope tracking, envelope following, average power tracking, and polar modulation, require the supply voltage, Vcc, to vary considerable amounts, up to, for example, twice a nominal value, which if applied to the prior art configurations of FIG. 1A and FIG. 2A, may cause thermal breakdown of the amplifier stages (112, 113). More information on such schemes can be found, for example, in the above referenced U.S. Pat. No. 9,413,298. Furthermore, the supply voltage, Vcc, may vary/increase due to unintended consequences, such as, for example, plugging/unplugging of a portable device to/from an external supply source. Although hard shutdown schemes as known in the art, wherein power to the amplifier module is removed may be used to protect the amplifier module against overvoltage, such schemes may also force interruption of any activity (e.g., transmission of an RF signal) related to operation of the amplifier module. It follows that there may be a need for improved overvoltage protection of the RF amplifier module (110) shown in the prior art configurations of FIGS. 1A and 2A that not only protects the amplifier from overvoltage (e.g., thermal breakdown), but also without interruption of an ongoing activity of the amplifier (e.g., soft shutdown). Teachings according to the present disclosure provide such improved overvoltage protection.

SUMMARY

According to a first aspect of the present disclosure, a circuit is presented, the circuit comprising: a bias circuit configured to supply a bias signal based on a control current; and a protection circuit configured to detect a level of a varying supply voltage and generate therefrom the control current having a control current high limit, wherein for a detected voltage of the varying supply voltage that is: i) lower than a preset supply voltage limit, the control current high limit is constant, and ii) higher than the preset supply voltage limit, the control current high limit is a linear function of the detected voltage of the varying supply voltage having a negative slope with respect to increasing values of the detected voltage.

According to a second aspect of the present disclosure, a method for limiting a high current through an amplifier operating between a varying supply voltage and a reference ground is presented, the method comprising: controlling a current high limit to the amplifier based on a detected value of the varying supply voltage, such that for values of the varying supply voltage above a preset supply voltage limit, the current high limit decreases linearly with respect to increasing values of the varying supply voltage, and based on the controlling, providing a nearly constant value of a maximum power dissipated through the amplifier for the values of the varying supply voltage above a preset supply voltage limit.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

Figure 3A:
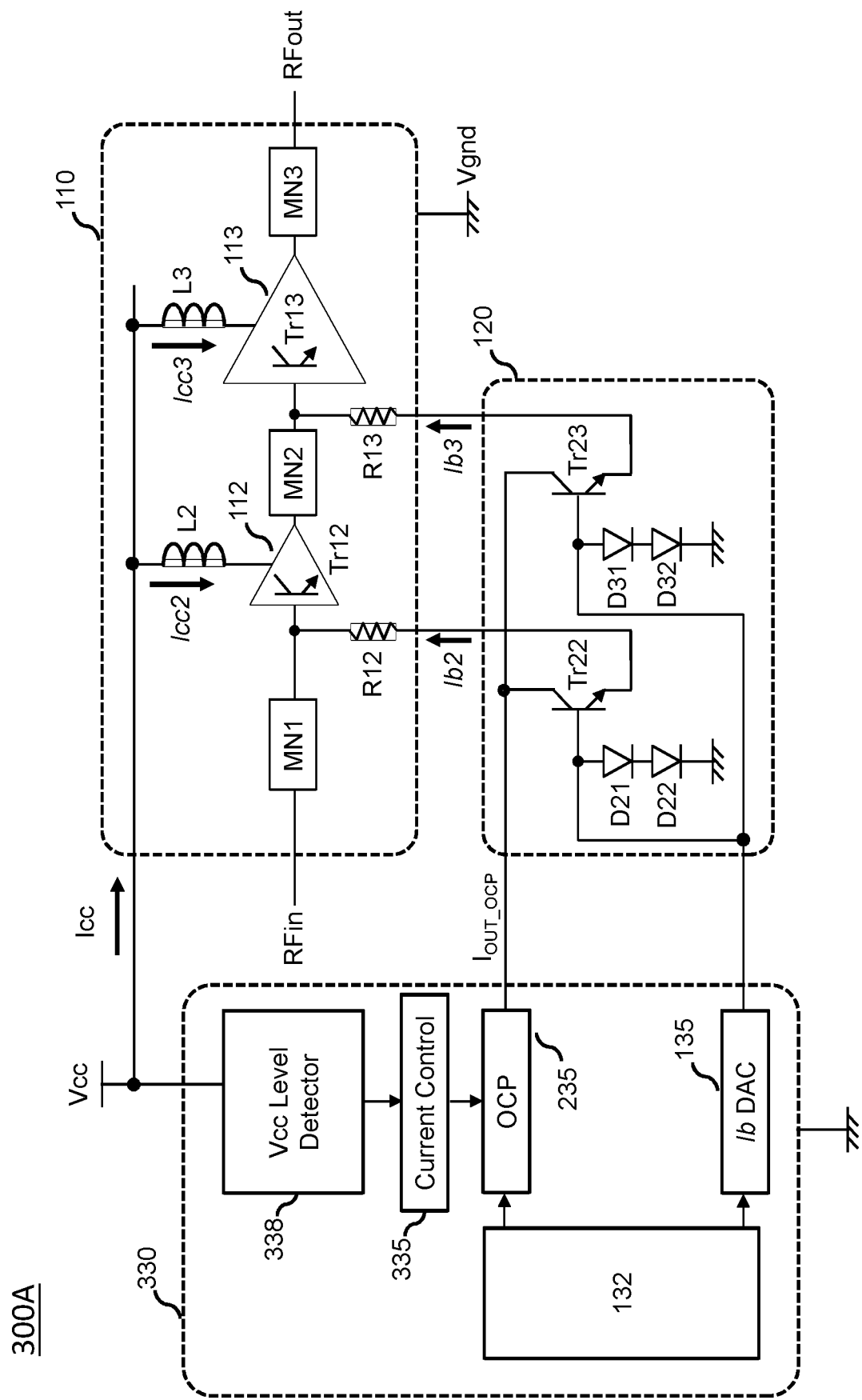
FIG. 3A shows a configuration according to an embodiment of the present disclosure of a RF power amplifier (PA) module and a biasing circuit to provide biasing signals to the PA module, wherein the biasing circuit decreases a current through the PA module for increasing values of a supply voltage to the PA module.

FIG. 3A shows a configuration (300A) according to an embodiment of the present disclosure comprising an RF power amplifier (PA) module (110) and a biasing circuit (120) to provide biasing signals to the PA module (110), wherein under control of a controller circuit (330), the biasing circuit (120) is configured to decrease high limits of collector currents (Icc2, Icc3) through the PA module (110) for increasing values of the supply voltage, Vcc, to the PA module (110). In other words, maximum current values, or high current limits, through the collectors of the common-emitter transistors (Tr12, Tr13) of the PA module (110) are decreased for higher values of the supply voltage, Vcc. According to an exemplary embodiment of the present disclosure, such decrease of the high current values is a linear decrease with respect to increasing values of the supply voltage, Vcc. Accordingly, to an embodiment of the present disclosure, the high current values are limited to a constant high value for values of the supply voltage, Vcc, below a limit voltage, Vcc_lm, and are limited according to a decreasing linear function of the supply voltage Vcc for increasing values of the supply voltage Vcc above the limit voltage, Vcc_lm. According to another exemplary embodiment of the present disclosure, the decreasing linear function can be segmented based on values of the supply voltage, Vcc, with linear segments having different slopes (negative slopes) with respect to the increasing values of the supply voltage, Vcc. It should be noted that although the biasing circuit (120) is described as a separate circuit from the PA module (110), mainly based on its separate functionality compared to the PA module, in some embodiments, the PA module (110) may be described as further comprising the biasing circuit (120), or even the controller circuit (330). Accordingly, such combination of circuits may be monolithically integrated as a single chip.

Figure 3B:
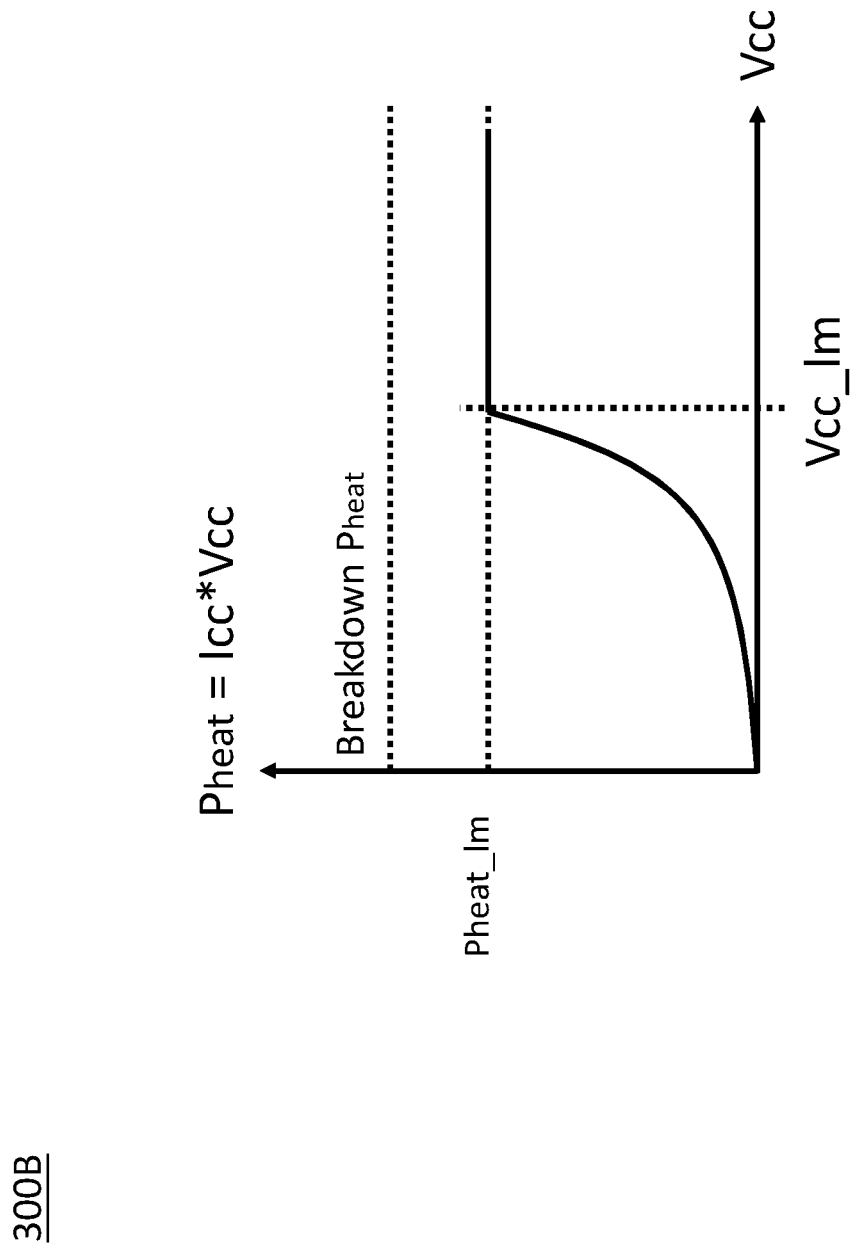
FIG. 3B shows a curve representative of a power dissipation of the PA module of FIG. 3A with respect to a varying supply voltage to the PA module.

Accordingly, as shown in FIG. 3B, power dissipation through the common-emitter transistors (Tr12, Tr13) of the configuration (300A) of FIG. 3A may increase as a quadratic function based on increasing values of the supply voltage, Vcc, up to the limit voltage, Vcc_lm, As shown in FIG. 3B, for increasing values of the supply voltage, Vcc, above the limit voltage, Vcc_lm, the linear decrease of the high current values counteracts with an increase of the supply voltage, Vcc, to effectively provide a constant power dissipation through the common-emitter transistors (Tr12, Tr13). In other words, for values of the varying supply voltage, Vcc, greater than the limit voltage, Vcc_lm, a product of the high current value and a voltage of the varying supply voltage is constant, or nearly constant (e.g., varies less than 20% over time or over the varying supply voltage range). According to an embodiment of the present disclosure, the value of the Vcc_lm (may be different for each of the transistors Tr12, Tr13) can be selected to restrict the constant power dissipation value to a high limit value, Pheat_lm, that is below the thermal breakdown limit of each of the common-emitter transistors (Tr12, Tr13). Accordingly, each of the common-emitter transistors (Tr12, Tr13) can operate at values of the supply voltage, Vcc, that are above the limit voltage, Vcc_lm, without requiring a power shutdown of the transistors. This allows any ongoing activity of the PA module (110) of the configuration shown in FIG. 3A to continue for higher values of the supply voltage, Vcc.

Figure 1A:
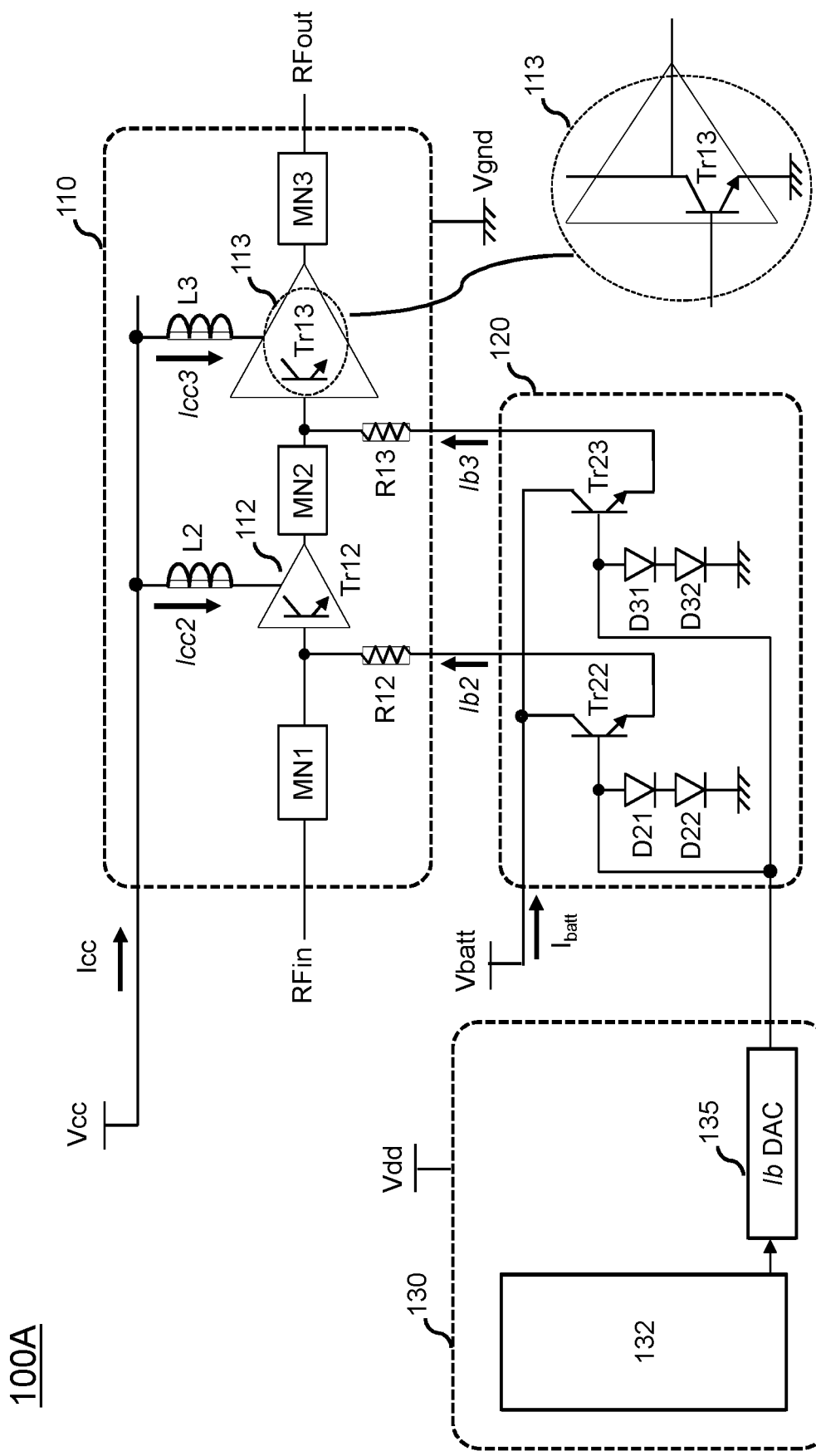
FIG. 1A shows a prior art RF power amplifier (PA) module and a biasing circuit to provide biasing signals to the PA module.
Figure 1B:
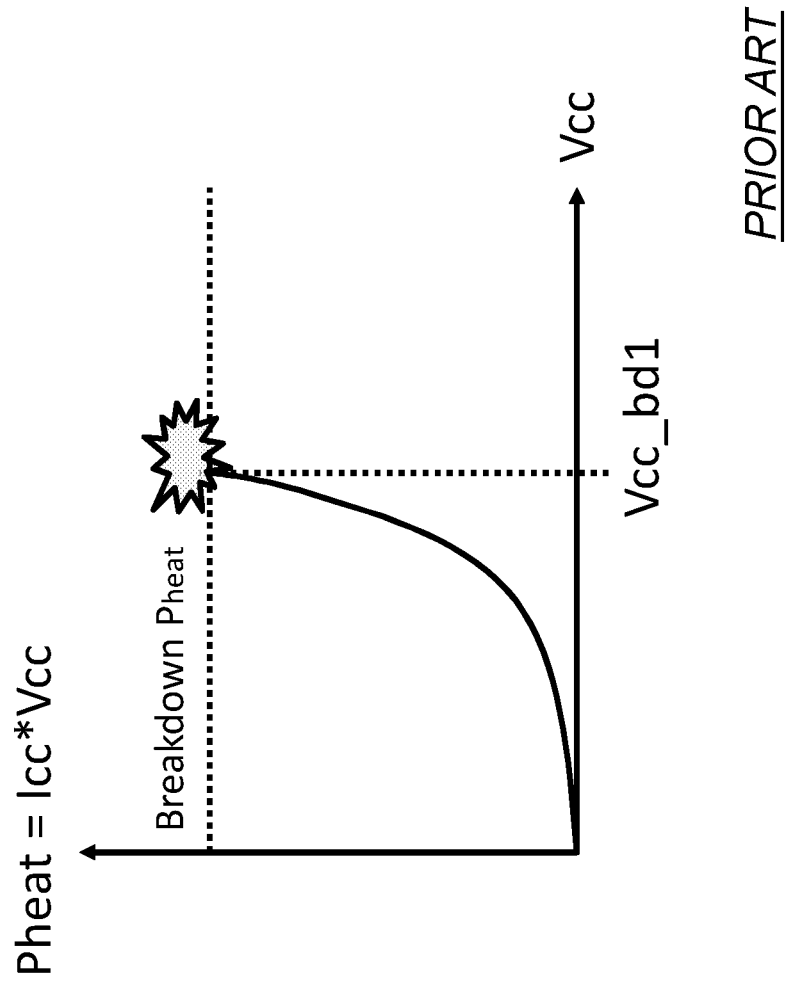
FIG. 1B shows a curve representative of a power dissipation of the PA module of FIG. 1A with respect to a varying supply voltage to the PA module.
Figure 2A:
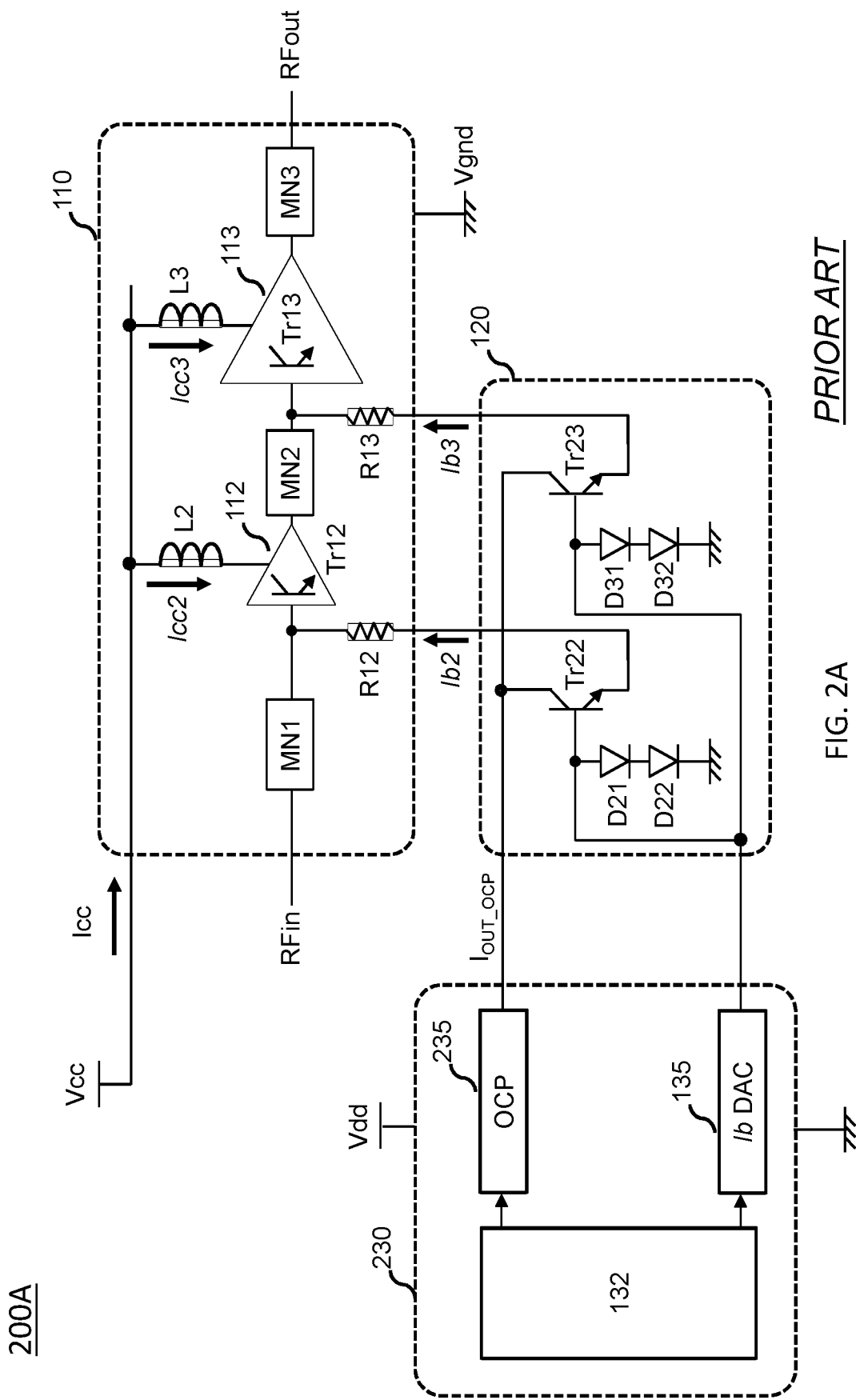
FIG. 2A shows a prior art RF power amplifier (PA) module and a biasing circuit to provide biasing signals to the PA module, wherein the biasing circuit limits a current through the PA module.
Figure 2B:
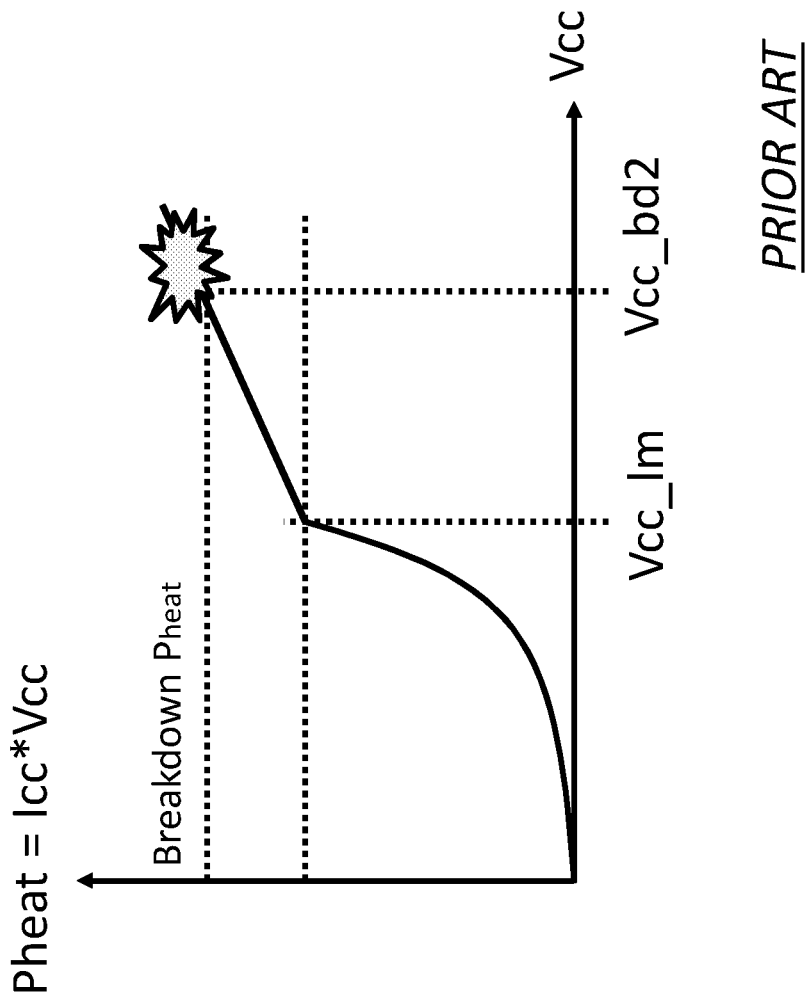
FIG. 2B shows a curve representative of a power dissipation of the PA module of FIG. 2A with respect to a varying supply voltage to the PA module.
Figure 7:
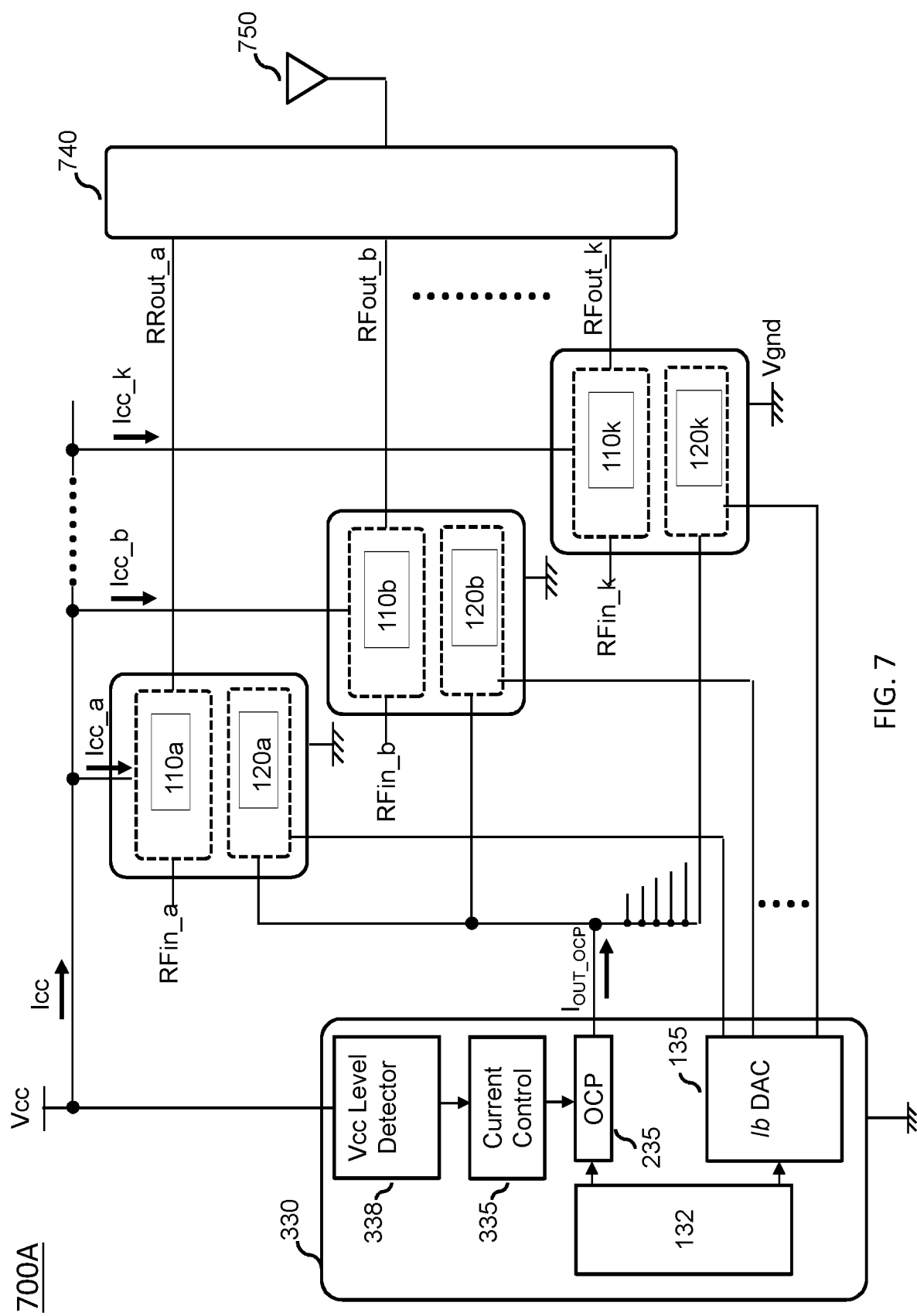
FIG. 7 shows a simplified block diagram of a transmitter section of an RF front-end communication system using a plurality of PA modules each according to the configuration shown in FIG. 3A and sharing a single overvoltage protection circuit per the configuration of FIG. 4A.

With reference back to FIG. 3A, according to an embodiment of the present disclosure, the controller circuit (330) detects a level of the supply voltage Vcc, and based on a value of the detected level of the supply voltage Vcc, generates a limited current, $I_{OUT\_OCP}$, that is supplied to the collector of the emitter-follower transistors (Tr22, Tr23) of the biasing circuit (120). As described above with reference to FIG. 2A, the limited current $I_{OUT\_OCP}$, defines (high) limits of the biasing currents (Ib2, Ib3) to the common-emitter transistors (Tr12, Tr13), which in turn define (high) limits of the collector currents (Ic2, Ic3). As can be seen in FIG. 3A, detection of the level of the supply voltage, Vcc, can be provided by a Vcc level detector circuit (338) that is coupled to the supply voltage, Vcc, which in turn provides a value of the detected level to a current control circuit (335) that controls the over current protection (OCP) circuit (235) to output the limited current, $I_{OUT\_OCP}$, that is limited to a high value based on the value of the detected level of the supply voltage, Vcc. According to a further embodiment of the present disclosure, the current control circuit (335) further controls a (negative) slope of the high value of the limited current, $I_{OUT\_OCP}$. In other words, such slope can be programmable. According to another embodiment of the present disclosure, the current control circuit (335) determines a value of the limit voltage, Vcc_lm, at which the slope starts. In other words, the value of the limit voltage, Vcc_lm, can be programmable. Programmability of the value and start location (i.e., start location based on Vcc_lm) of the slope via the combination of the Vcc level detector circuit (338) and the current control circuit (335), allows the OCP circuit (235) to be used to control biasing currents to a plurality of different PA modules part of, for example, a same transmitter section of an RF front-end communication system as shown in FIG. 7 later described.

Figure 4A:
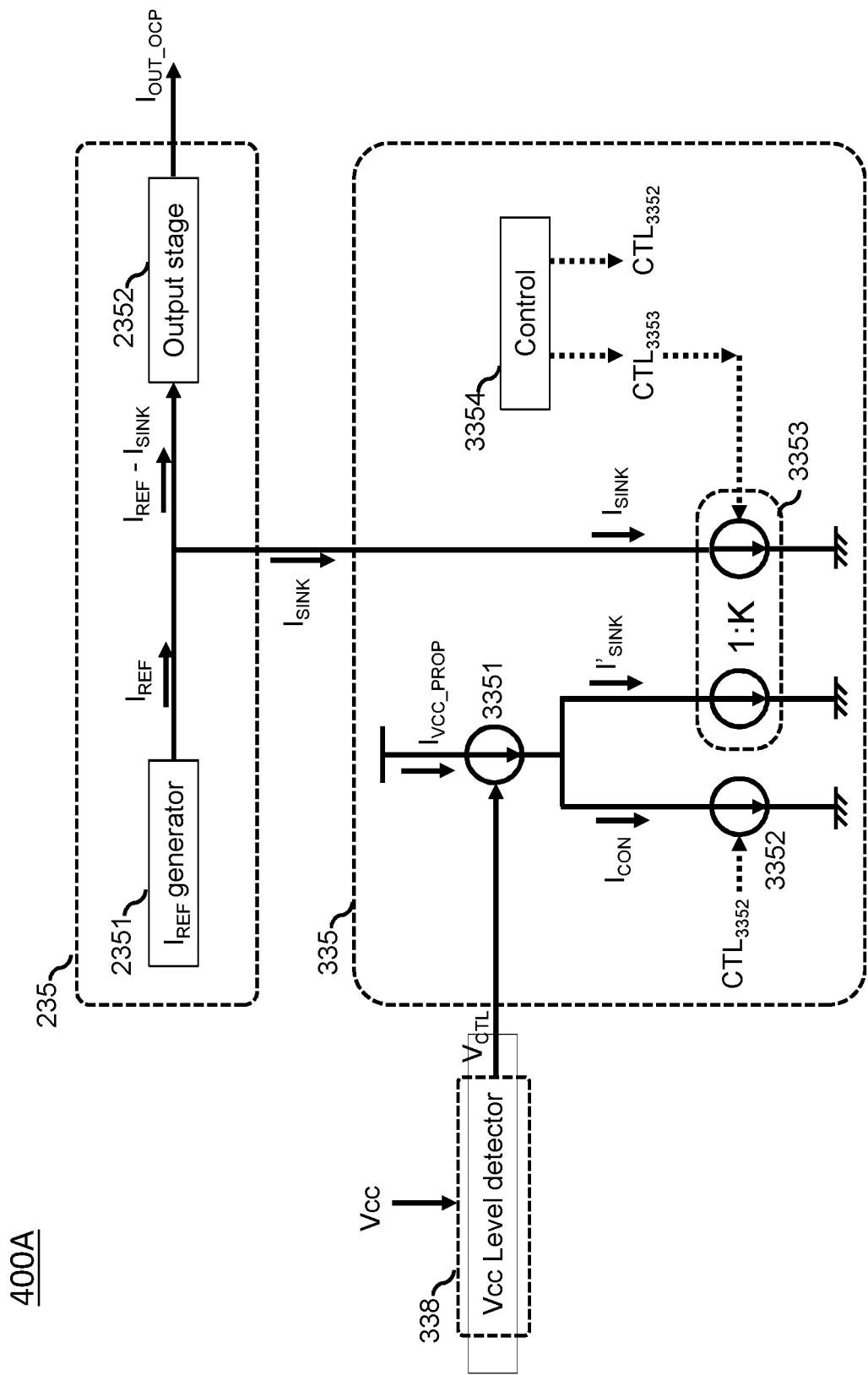
FIG. 4A shows a simplified schematic of an overvoltage protection circuit according to an embodiment of the present disclosure.

FIG. 4A shows a simplified schematic (400A) of elements (235, 335, 338) of the controller circuit (330) shown in FIG. 3A, including elements (335, 338) that are used to provide overvoltage protection according to the present teachings. As shown in FIG. 4A, the Vcc level detector circuit (338), coupled to the supply voltage, Vcc, detects a level of the supply voltage, Vcc, and generates therefrom, a control signal, $V_{CTL}$, to control a magnitude of a current, $I_{VCC\_PROP}$, output by a current source (3351) of the current control circuit (335). According to an embodiment of the present disclosure, the magnitude of the current, $I_{VCC\_PROP}$ is proportional to the level of the supply voltage, Vcc. In other words, within a voltage range of interest, $I_{VCC\_PROP}=k*Vcc$. This can be provided by, for example, changing a number of parallel current sources (current mirrors) of the current source (3351) via designs and methods well known to a person skilled in the art, details of which are beyond the scope of the present disclosure.

With continued reference to FIG. 4A, the current source (3351) is in series connection with two separate current paths, one path including a current source (3352) and another path including a reference leg of a current mirror (3353). As clearly understood to a person skilled in the art, so long the current $I_{VCC\_PROP}$ is smaller than the current $I_{CON}$ that is generated by the current source (3352), the entirety of the current $I_{VCC\_PROP}$ flows through the current source (3352) and therefore no current flows through the reference leg of the current mirror (3353). In other words, the current $I'_{SINK}$ through the reference leg and the corresponding current $I_{SINK}$ through the target leg of the current mirror (3353) are null. On the other hand, when the current $I_{VCC\_PROP}$ is greater than the current $I_{CON}$ that is generated by the current source (3352), a surplus (difference) current $I_{VC\_PROP}-I_{CON}$ above what the current source (3352) can source flows through the reference leg of the current mirror (3353), and consequently a corresponding current $I_{SINK}=K*I'_{SINK}=K*(I_{VC\_PROP}-I_{CON})$ flows through the target leg of the current mirror (3353), wherein K is a number corresponding to a ratio of currents between the reference and target legs of the current mirror (3353).

According to the above description, the current $I_{SINK}$ through the target leg of the current mirror (3353) is: i) equal to zero for (detected) values of the supply voltage, Vcc, for which $I_{VCC\_PROP} \leq I_{CON}$, and ii) equal to $K*(I_{VC\_PROP}-I_{CON})$ for values of the supply voltage, Vcc, for which $I_{VCC\_PROP} > I_{CON}$. As the current $I_{VCC\_PROP}$ is proportional to the value of the supply voltage, Vcc, it follows that for a given value of the current $I_{CON}$, the current $I_{SINK}$ is also proportional to the value of the supply voltage, Vcc, and therefore $I_{SINK}$ increases proportionally with an increasing value of the supply voltage, Vcc, when $I_{SINK}$ in not equal to zero. Furthermore, a rate of increase, or slope, of the current $I_{SINK}$ with respect to an increasing value of the supply voltage, Vcc, is based on the number K. In other words, by programmatically changing the value of K, the slope of the current $I_{SINK}$ (when not zero) can be changed. A person skilled in the art is well aware of design techniques for providing a parametric (programmable) ratio K of a current mirror (e.g., 3353). Finally, by programmatically changing a magnitude of the current $I_{CON}$ generated by the current mirror (3352), start of flow of current $I'_{SINK}$ through the reference leg, therefore flow of current $I_{SINK}$ through the target leg, of the current mirror (3353), can be changed as a linear function of a value of the supply voltage, Vcc. In other words, for a higher value of the current $I_{CON}$, a proportionally higher value of the supply voltage, Vcc, is required to start flow of current through the current mirror (3353). Accordingly, programmability of the current source (3352) and of the ratio of the current mirror (3353) can respectively provide position and magnitude of a slope of the current $I_{SINK}$. According to an exemplary embodiment of the present disclosure, as shown in FIG. 4A, programming of the current source (3352) and of the current mirror (3353) can be provided via a control circuit (3354) that generates respective control signals ($CTL_{3352}$, $CTL_{3353}$). According to alternative embodiment, the control circuit (3354) may be external to the current control circuit (335), such as, for example, part of a signal aware controller such as a transceiver system. It should be noted that control of various controllable and/or programmable elements/circuits according to the present teachings may require control lines and signals that may not be shown in the present figures, but certainly well understood by a person skilled in the art.

Figure 4B:
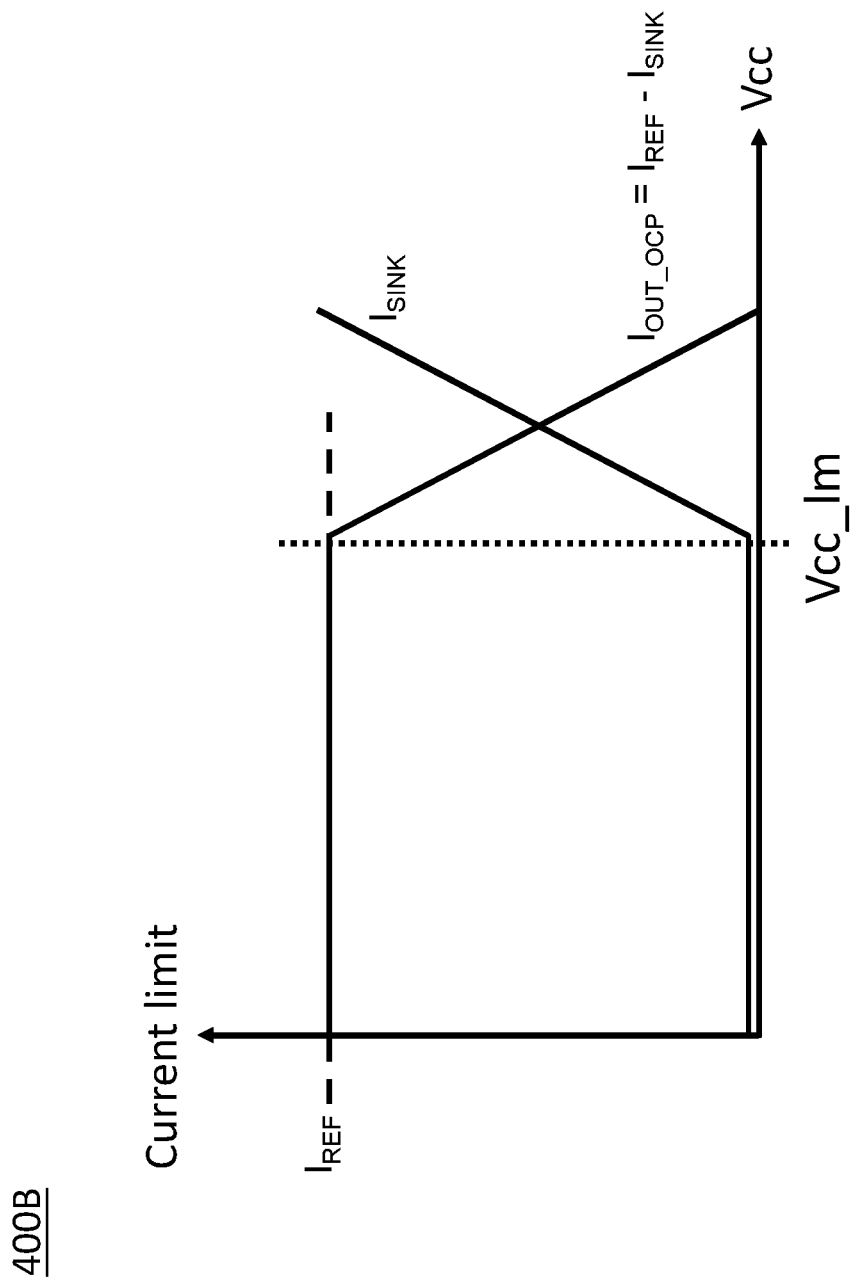
FIG. 4B shows curves representative of two currents and subtraction of such currents performed by the overvoltage protection circuit of FIG. 4A as a function of a varying supply voltage to the PA module of FIG. 3A.

With continued reference to FIG. 4A, the OCP circuit (235) includes a reference current generation circuit (2351) that generates a reference limited current, Iref, from which the current $I_{SINK}$ generated by the current control circuit (335) is subtracted, to generate, as shown in FIG. 4A, a limited current ($Iref-I_{SINK}$) that is fed to an output stage (2352) that may multiply such current to generate a larger limited current, $I_{OUT\_OCP}$, provided to the biasing circuit (120) shown in FIG. 3A. Accordingly, for values of the supply voltage, Vcc, such that $I_{SINK}$ is equal to zero, the limited current, $I_{OUT\_OCP}$, is limited by a fixed amount determined by the reference limited current, Iref, and for values of the supply voltage, Vcc, such that $I_{SINK}$ is not equal to zero, the limited current, $I_{OUT\_OCP}$, is limited by an amount determined by the reference limited current, Iref, minus the current $I_{SINK}$, that as described above, is a linear function of the supply voltage, Vcc. Corresponding graphs are shown in FIG. 4B, including a) the reference limited current, Iref, having a constant current limit b) a current $I_{SINK}$ having zero value for values of the supply voltage below a limit, Vcc_lm, and positive non-zero values with a positive slope for values of the supply voltage above the limit, Vcc_lm, and c) a limited current based on a difference of the reference limited current, Iref, and the current $I_{SINK}$.

Figure 5:
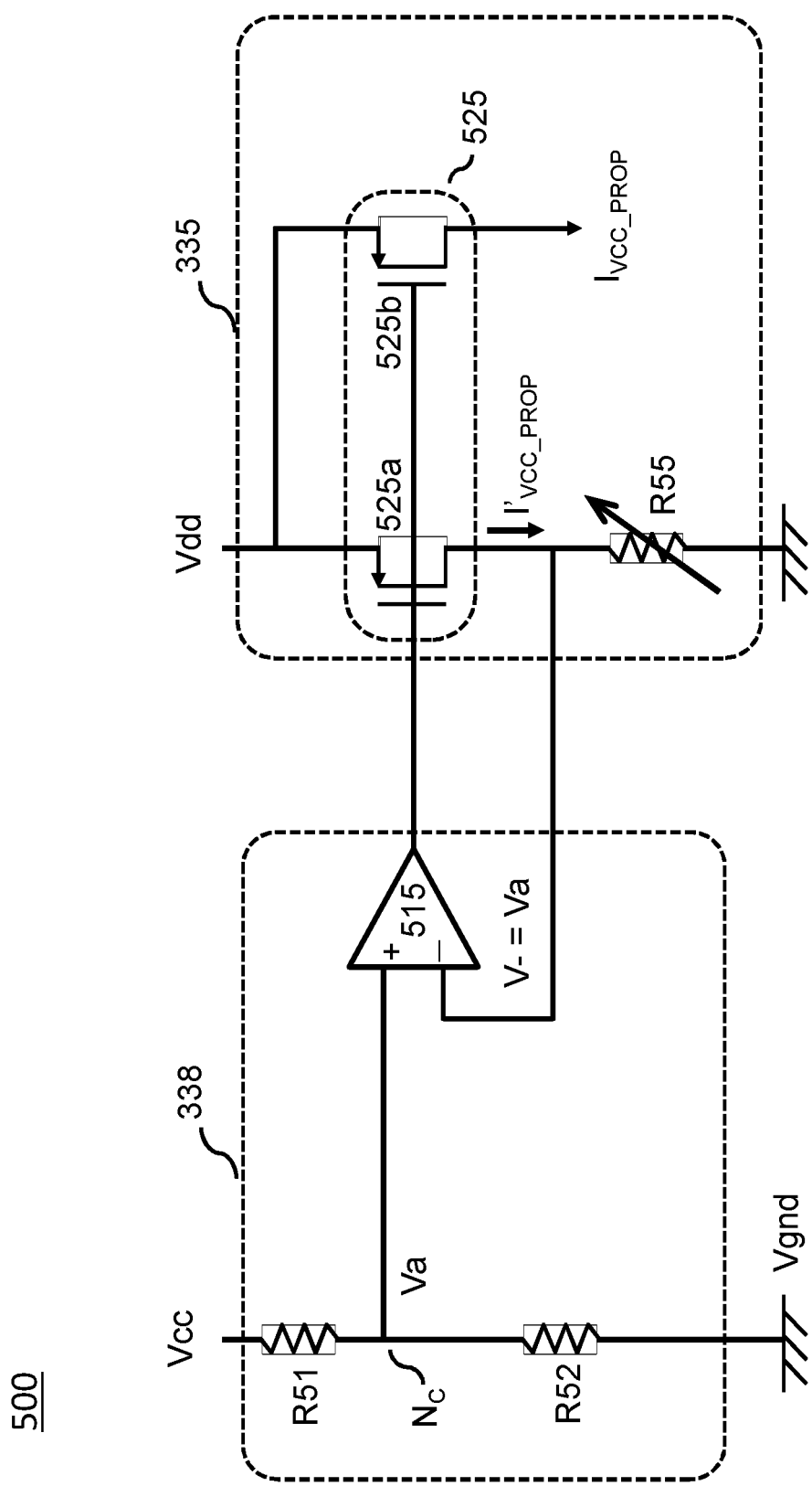
FIG. 5 shows a simplified schematic of a voltage to current convertor circuit used in the overvoltage protection circuit shown in FIG. 4A.

FIG. 5 shows a simplified schematic according to an exemplary embodiment of the present disclosure of a voltage to current convertor circuit (500) used in the overvoltage protection circuit (335, 338) shown in FIG. 4A. As shown in FIG. 5, a level of the supply voltage, Vcc, is detected via a resistor divider network that includes two series connected resistors R51 and R52, the resistor divider network coupled between the supply voltage, Vcc, and the reference ground, Vgnd. Accordingly, a detected voltage, Va, corresponding to a voltage level of the supply voltage, Vcc, is provided at a common node, $N_C$, used in the series connection of the two resistors (R51, R52). An operational amplifier (515) connected in a non-inverting configuration receives, at its non-inverting input terminal (annotated by sign + in the figure), the detected voltage, Va. Accordingly, the voltage at the inverting input terminal (annotated by sign − in the figure) of the operational amplifier (515), takes the detected voltage, Va, which is provided to a shunted resistor R55 coupled between the inverting input terminal of the operational amplifier (515) and the reference ground, Vgnd. As shown in FIG. 5, a current mirror (525), including a first PMOS transistor (525a) part of a reference leg of the current mirror (525) and a second PMOS transistor (525b) part of a target leg of the current mirror (525) is coupled to the operational amplifier (515) such that gates of the first and second PMOS transistors (525a, 525b) are connected/coupled to an output terminal of the operational amplifier (515) and a drain of the first PMOS transistor (525a) is coupled to a common node that couples the inverting input terminal of the operational amplifier (515) and the shunted resistor R55. Furthermore, the sources of the first and second PMOS transistors (525a, 525b) are coupled to a (substantially) fixed supply voltage Vdd. Such fixed supply voltage Vdd may be a regulated voltage based on, for example, a battery. In some non-limiting exemplary embodiments, the fixed supply voltage, Vdd, may be at about 3 volts, whereas the supply voltage Vcc may vary from about 3 volts up to about 6.5 volts or more.

With continued reference to FIG. 5, because the voltage at the drain of the first transistor (525a) is equal to the detected voltage, Va, a current $I'_{VCC\_PROP}$ through the shunted resistor R55, and therefore through the reference leg (i.e., through 525a) of the current mirror (525), is equal to Va/R55, and is therefore proportional to the detected voltage, Va. Accordingly, the current $I_{VCC\_PROP}$ that flows through the target leg (i.e., through 525b) of the current mirror (525), which is a scaled version of the current $I'_{VCC\_PROP}$ that flows through the reference leg, is also proportional to the detected voltage, Va, and therefore proportional to the value of the supply voltage, Vcc. Accordingly, the circuit shown in FIG. 5 generates the current, $I_{VCC\_PROP}$ described above with reference to FIGS. 3A and 4A that is proportional to the detected level, Va, of the supply voltage, Vcc. As known to a person skilled in the art, a ratio in size between the transistor (525b) and the transistor (525a) can determine scaling (i.e., ratio) of the current $I_{VCC\_PROP}$ through the transistor (525b) with respect to the current $I'_{VCC\_PROP}$ through the transistor (525a).

With continued reference to FIG. 5, according to an exemplary embodiment of the present disclosure, the shunted resistor R55 may optionally have a programmable, variable, settable resistance than can be controlled/varied in steps and/or continuously. Such programmability of the resistor R55 can allow calibration of the voltage versus current response provided by the resistor R55 in the circuit shown in FIG. 5. Such programmability may be used to overcome large resistance variations in a fabrication process (e.g., CMOS process) used to fabricate the circuit shown in FIG. 5. Such calibration via tweaking of resistance value of the resistor R55 can be performed at any stage of integration of the circuit shown in FIG. 5, including at a factory prior to shipment and/or at an assembly site where the circuit of FIG. 5, which may be integrated with the circuit shown in FIG. 3A, is assembled as part of a transmitter device, such as, for example, a portable/handheld mobile device.

According to an embodiment of the present disclosure, a discriminator circuit can be included in the circuit shown in FIG. 5 to discriminate between high-voltage high-frequency components of the Vcc supply voltage from high-voltage lower-frequency components, as the former components may be inherent to an RF amplification scheme based on, for example, envelope tracking of the RF signal, and due to their short duration may not contribute to excess power dissipation within the RF amplifier. A person skilled in the art would know of many circuit designs to implement such discriminator function, such as, for example, a low pass filter placed before the non-inverting terminal of the operational amplifier (515) of FIG. 5.

Figure 6A:
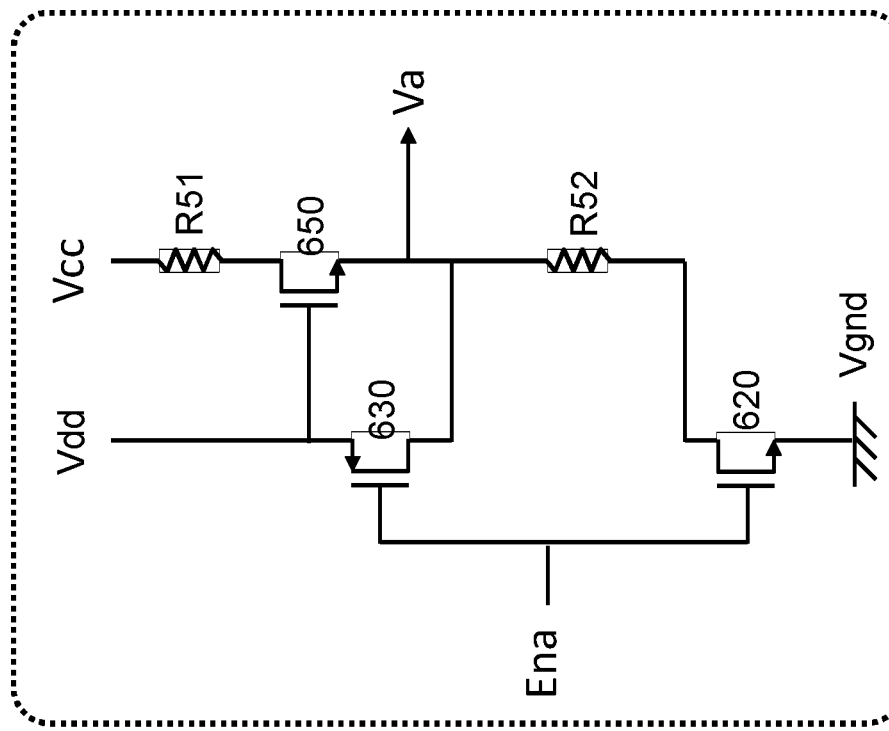
FIG. 6A shows a simplified schematic of a shutdown circuit with transistor protection according to an embodiment of the present disclosure that can be used to shut down a flow of current through the current convertor circuit of FIG. 5.

According to an embodiment of the present disclosure, a current flow through the resistive divider network (R51, R52) of FIG. 5 can be controlled, such as to, for example, reduce power consumption during a standby mode or a deactivated mode of the PA module (110) shown in FIG. 3A. FIG. 6A shows a simplified schematic of a shutdown circuit (600A) with transistor protection according to an embodiment of the present disclosure that can be used to shut down flow of current through the resistive divider network (R51, R52) shown in FIG. 5. Because the supply voltage, Vcc, can vary and reach higher voltage levels (e.g., 4 volts to 6.5 volts) beyond tolerable voltage levels (e.g., withstand voltage less than about 3.5 volts) of low voltage transistors (620, 630, 650) that are exclusively used in the shutdown circuit (600A), it is important that such circuit protects the low voltage transistors from being subjected to the higher voltage levels of the supply voltage, Vcc.

As shown in FIG. 6A, the shutdown circuit (600A) includes an NMOS transistor (650) that is coupled at its drain to a first terminal of the resistor R51, and is coupled at its source to a first terminal of the resistor R52. In other words, the NMOS transistor (650), acting as a switch, is in series connection between the resistor R51 and the resistor R52, so that a flow of a current through the two resistors can be controlled via the NMOS transistor (650). Furthermore, a second terminal of the resistor R51 is coupled to the supply voltage, Vcc, and a second terminal of the resistors R52 is coupled to a drain of an NMOS transistor (620), with a source of the NMOS transistor coupled to the reference ground, Vgnd. In other words, the NMOS transistor (620), acting as a switch, is in series connection between the resistor R52 and the reference ground, Vgnd, so that a flow of current through the resistor R52 can be controlled via the NMOS transistor (620). Accordingly, as it would be clear to a person skilled in the art, a current flow from the supply voltage, Vcc, to the reference ground, Vgnd, to provide a detected level, Va, of the supply voltage, Vcc, via a voltage division provided by the resistors R51 and R52, can only be present when both NMOS transistors (650) and (620) are conducting (i.e., turned ON, activated).

With further reference to the shutdown circuit (600A) of FIG. 6A, there is further provided a PMOS transistor (630) having: i) a source connected to the fixed supply voltage, Vdd, and to a gate of the NMOS transistor (650), ii) a drain connected to the source of the NMOS transistor (650) which carries the detected level, Va, when current flows through the resistors (R51, R52) (e.g., PA module is active and shutdown circuit is inactive), and iii) a gate connected to a gate of the NMOS transistor (620) for receiving a control signal, Ena, that controls an active state (i.e., current does not flow through the resistors R51 and R52) and an inactive state (i.e., current flows through the resistors R51 and R52) of the shutdown circuit (600A).

Figure 6B:
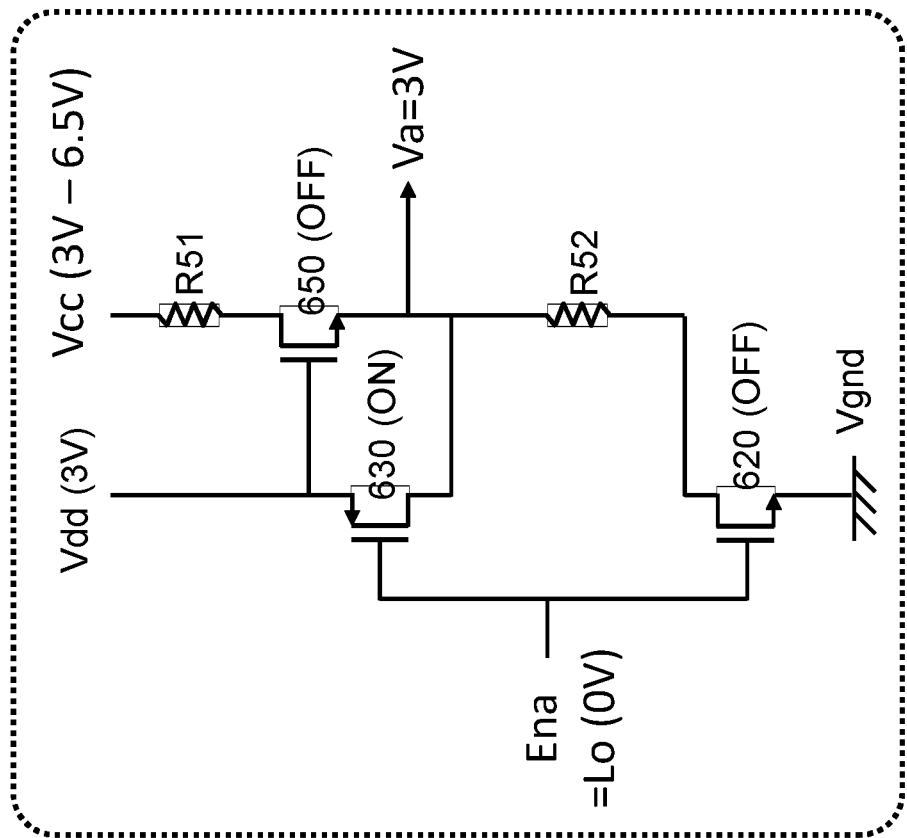
FIG. 6B shows the shutdown circuit of FIG. 6A in an enabled state.

FIG. 6B shows the shutdown circuit (600A) in an active state, so that no current flows through the resistors R51 and R52 for an exemplary case wherein Vdd is equal to about 3 volts and the supply voltage, Vcc, varies from about 3 volts to about 6.5 volts. Because the control signal, Ena, is at zero volts (i.e., Ena=0V), the NMOS transistor (620) is turned OFF (does not conduct current) and the PMOS transistor (630) is turned ON (conducts current). Accordingly, no current flows through the resistor R52. Furthermore, because the PMOS transistor (630) is ON, a voltage at the source of such transistor is substantially equal to the voltage at the source of the transistor (i.e., Vdd), and accordingly the voltage (i.e., Va) at the source of the NMOS transistor (650) is substantially equal to Vdd. Therefore, a gate-to-source voltage of the NMOS transistor (650) is about zero volts and the transistor (650) is OFF as shown in FIG. 6B. Similarly, the gate-to-source voltage of the NMOS transistor (620) is also about zero volts and therefore such transistor is also OFF. Accordingly, there is no current flow through the resistors R51 and R52 for a saving in power consumption, such as required, for example, during a standby mode of operation of the PA module (110) shown in FIG. 3A. Furthermore, because Va is at about the same voltage as Vdd (e.g., 3V), each of the transistors (650) and (620) are subject to a voltage that is within their tolerable voltage range (e.g., about 3.5 volts). Finally, as shown in FIG. 6B, the PMOS transistor (630) is not subjected to any voltage higher than Vdd (e.g., for Vdd of 3 volts, no voltage difference between any two terminals of the transistor is above Vdd).

Figure 6C:
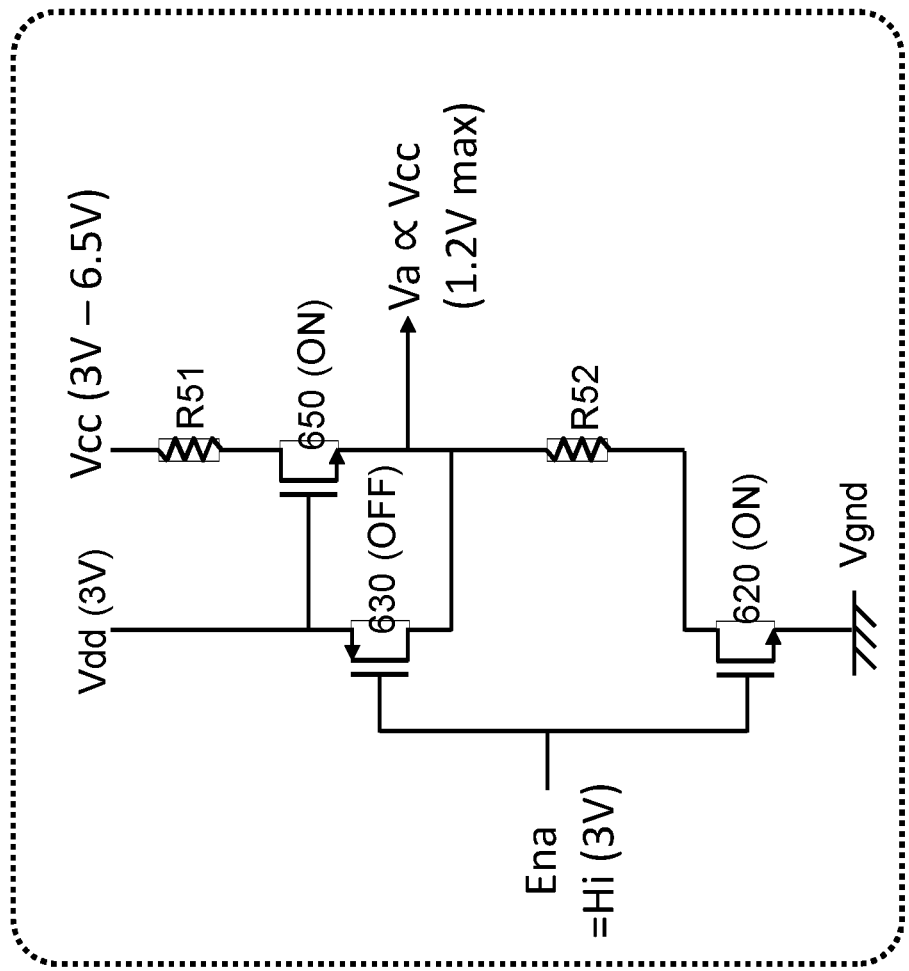
FIG. 6C shows the shutdown circuit of FIG. 6A in a disabled state.

FIG. 6C shows the shutdown circuit (600A) is an inactive state, so that a current does flow through the resistors R51 and R52 for an exemplary case wherein Vdd is equal to about 3 volts and the supply voltage, Vcc, varies from about 3 volts to about 6.5 volts. Because the control signal, Ena, is at about a same level as the fixed voltage Vdd (i.e., Ena=3V), the NMOS transistor (620) is turned ON (conducts current) and the PMOS transistor (630) is turned OFF (does not conduct current). Because the PMOS transistor (630) is OFF, a gate-to-source voltage of the NMOS transistor (650) is large enough to turn ON the transistor as shown in FIG. 6B. Accordingly, because both NMOS transistors (620, 650) are ON, a current flows through the resistors R51 and R52 to provide a voltage, Va, at the source of the NMOS transistor (650) that is representative of a voltage level of the supply voltage, Vcc (e.g., linear function via resistive voltage division). According to an exemplary embodiment of the present disclosure, resistance ratios of the resistors R51 and R52 can be chosen such that a maximum value of the voltage, Va, for a varying supply voltage, Vcc, that can be up to about 6.5 volts, is equal to or less than 1.2 volts as shown in the figure. Such selection of the ratios can guarantee that given the range of the varying supply voltage, Vcc, no transistor of the circuit is subjected to a voltage that is greater than about 3.5 volts while the circuit actively detects a level of the varying supply voltage, Vcc, as required during an active mode of operation of the PA module (110) shown in FIG. 3A.

FIG. 7 shows a simplified block diagram of a transmitter section of an RF front-end communication system using a plurality of PA modules (110a, 110b, . . . , 110k) each according to the configuration shown in FIG. 3A coupled to respective biasing circuits (120a, 120b, . . . , 120k), and sharing a single overvoltage protection circuit (335 and 338) per the configuration of FIG. 4A. As described above with reference to FIG. 4A, and in further view of the curves described above with reference to FIG. 4B, programmability, via the combination of the Vcc level detector circuit (338) and the current control circuit (335), of a value of the slope (rate of change with respect to change of Vcc) and start location of the slope (i.e., based on Vcc_lm) of the limited current, $I_{OUT\_OCP}$, output by the OCP circuit (235) shown in FIG. 7, allows the OCP circuit (235) to be used to control biasing currents to a plurality of different PA modules (110a, 110b, . . . , 110k) part of, for example, a same transmitter section of an RF front-end communication system.

With continued reference to FIG. 7, at any given time, one of the plurality of PA modules (110a, 110b, . . . , 110k) may be coupled to an antenna (750) via an antenna switch (740) for transmission of an amplified RF signal (RFout_a, RFout_b, . . . , RFout_k). Accordingly, based on the description above with reference to FIG. 3A, in view of a selected PA module (e.g., 110b) coupled to the antenna (750), the DAC converter (135) may control the base voltage of the emitter-follower transistors (e.g., Tr22, Tr23) of a corresponding biasing circuit (120b) so that a desired biasing signal can be output at the emitter of each such emitter-follower transistor for biasing of the PA module (110b). Concurrently, slope and position of the slope of the limited current, $I_{OUT\_OCP}$ can be programmed based on, for example, thermal characteristics of the selected PA module (110b).

Figure 8:
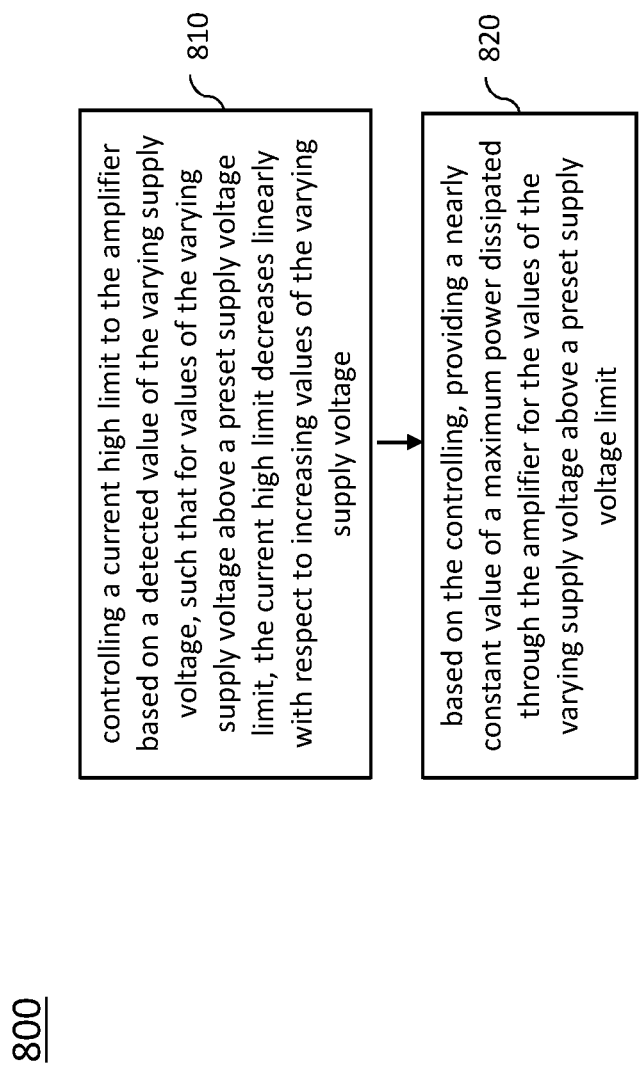
FIG. 8 is a process chart showing various steps of a method according to an embodiment of the present disclosure for limiting a high current through an amplifier operating between a varying supply voltage and a reference ground.

FIG. 8 is a process chart (800) showing various steps of a method for limiting a high current through an amplifier operating between a varying supply voltage and a reference ground. As can be seen in the process chart (800), the method comprises: controlling a current high limit to the amplifier based on a detected value of the varying supply voltage, such that for values of the varying supply voltage above a preset supply voltage limit, the current high limit decreases linearly with respect to increasing values of the varying supply voltage, per step (810), and based on the controlling, providing a nearly constant value of a maximum power dissipated through the amplifier for the values of the varying supply voltage above a preset supply voltage limit, per step (820).

It should be noted that the various embodiments of the PA module with overvoltage protection circuit for soft shut-down according to the present disclosure may be implemented as a monolithically integrated circuit (IC) according to any fabrication technology and process known to a person skilled in the art.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functions without significantly altering the functionality of the disclosed circuits.

The examples set forth above are provided to give those of ordinary skill in the art a complete disclosure and description of how to make and use the embodiments of the gate drivers for stacked transistor amplifiers of the disclosure, and are not intended to limit the scope of what the applicant considers to be the invention. Such embodiments may be, for example, used within mobile handsets for current communication systems (e.g. WCDMA, LTE, WiFi, etc.) wherein amplification of signals with frequency content of above 100 MHz and at power levels of above 50 mW may be required. The skilled person may find other suitable implementations of the presented embodiments.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. A circuit comprising:
   a bias circuit configured to supply a bias signal based on a control current; and
   a protection circuit configured to detect a level of a varying supply voltage and generate therefrom the control current having a control current high limit,
   wherein for a detected voltage of the varying supply voltage that is:
      i) lower than a preset supply voltage limit, the control current high limit is constant, and
      ii) higher than the preset supply voltage limit, the control current high limit is a function of the detected voltage of the varying supply voltage having a negative slope with respect to increasing values of the detected voltage, and
   wherein the control current does not exceed the control current high limit.

2. The circuit of claim 1, further comprising an amplifier that is configured to operate between a varying supply voltage and a reference ground.

3. The circuit of claim 2, wherein the bias circuit comprises an emitter follower transistor that is configured to supply the bias signal to the amplifier.

4. The circuit of claim 3, wherein the control current is provided to a collector of the emitter follower transistor.

5. The circuit of claim 3,
   wherein the amplifier comprises a first amplification stage comprising a common-emitter transistor, the common-emitter transistor comprising:
      a collector coupled to the varying supply voltage;
      an emitter coupled to the reference ground, and
      a base coupled to an emitter of the emitter-follower transistor for receiving the bias signal, and
   wherein for values of the varying supply voltage greater than the preset supply voltage limit, a product of: a) a maximum current conducted between the collector and the emitter of said transistor, and b) a voltage of the varying supply voltage, has a nearly constant value.

6. The circuit of claim 5,
   wherein said constant value is representative of a maximum power dissipation through the first amplification stage and is configured to be below a thermal breakdown limit of the first amplification stage.

7. The circuit of claim 2, wherein the control current is based on a combination of:
   a reference current that is generated by a reference current source that is independent from the varying supply voltage, the reference current having a reference current high limit that is constant, and
   a sink current, wherein for a detected voltage of the varying supply voltage that is:
      i) lower than the preset supply voltage limit, the sink current is zero, and
      ii) higher than the preset supply voltage limit, the sink current is a linear function of the detected voltage having a positive slope with respect to increasing values of the detected voltage, the positive slope having a same magnitude as the negative slope of the control current.

8. The circuit of claim 7, wherein the control current is based on a subtraction of the sink current from the reference current.

9. The circuit of claim 7, wherein the protection circuit comprises:
   a voltage level detector circuit that is configured to detect the level of the varying supply voltage;
   a first current source that is configured to generate a current that is proportional to the detected level of the varying supply voltage;
   a second current source in series connection with the first current source; and
   a first current mirror comprising a reference current leg and a target current leg, the reference current leg in series connection with the first current source,
   wherein when a current generated by the first current source is larger than a current generated by the second current source, a current flows through the reference current leg of the first current mirror, else no current flows through the reference current leg, and
   wherein the sink current flows through the target current leg of the first current mirror.

10. The circuit of claim 9, wherein the current generated by the second current source is programmable and based on a value of the preset supply voltage limit.

11. The circuit of claim 9, wherein a ratio of a current through the target current leg with respect to a current through the reference current leg of the first current mirror provides the positive slope.

12. The circuit of claim 11, wherein the ratio is programmable.

13. The circuit of claim 9, wherein the voltage level detector circuit comprises:
   series connected resistors coupled between the varying supply voltage and the reference ground, a common node of the series connected resistors providing the detected voltage; and
   an operational amplifier comprising:
      a non-inverting input coupled to the common node; and
      an inverting input coupled to a shunted resistor,
   wherein a current through the shunted resistor is proportional to the detected voltage.

14. The circuit of claim 13, wherein:
   the first current source is a target current leg of a second current mirror, and
   a reference current leg of the second current mirror is in series connection with the shunted resistor.

15. The circuit of claim 14, wherein:
   the reference current leg of the second current mirror comprises a reference transistor,
   a gate of the reference transistor is coupled to an output of the operational amplifier, and
   a drain of the reference transistor is coupled to the shunted resistor and the inverting input of the operational amplifier.

16. The circuit of claim 2,
   wherein the circuit is configured to operate according to at least an active mode for current amplification and a standby mode for no current amplification with reduced current consumption,
   wherein the protection circuit comprises a level detector circuit that:
      during operation in the active mode, is configured to detect the level of the varying supply voltage based on a current through series connected resistors coupled between the varying supply voltage and the reference ground, and
      during operation in the standby mode, is configured to shut off flow of the current through the series connected resistors exclusively via a plurality of low voltage FET switches having respective withstand voltages below higher values of the varying supply voltage.

17. The circuit of claim 16, wherein the level detector circuit comprises:
   a series connection sequence of a first resistor, a first NMOS FET switch, a second resistor, and a second NMOS switch coupled between the varying supply voltage at a terminal of the first resistor and the reference ground at a source node of the second NMOS switch; and
   a PMOS FET switch comprising:
      a source node coupled to a fixed supply voltage having a voltage level that is below the respective withstand voltages;
      a drain node coupled to a common node of the first NMOS FET switch and the second terminal, the common node configured to carry the level of the varying supply voltage during operation in the active mode, and
      a gate node that is coupled to a gate node of the second NMOS FET switch for receiving a control signal to selectively enable/disable operation according to the active/standby mode of operation.

18. The circuit of claim 16,
   wherein the higher values of the varying supply voltage are in a range between 4 volts and 6.5 volts, and
   wherein the respective withstand voltages are smaller than about 3.5 volts.

19. The circuit of claim 5,
   wherein the amplifier comprises a second amplification stage that is in a cascaded arrangement with the first amplification stage, and
   wherein the bias circuit comprises an additional emitter-follower transistor configured to supply an additional bias signal to the second amplification stage based on the control current provided to a collector of the additional emitter-follower transistor.

20. The circuit of claim 2, further comprising additional one or more amplifiers and additional respective one or more bias circuits configured to supply respective bias signals,
   wherein at any given time, the circuit processes an RF signal through one only of the amplifier and the additional one or more amplifiers, and
   wherein protection circuit is further configured to generate, based on a detected level of the varying supply voltage, the control current based on an amplifier-specific preset supply voltage limit and negative slope of the control current high limit.

21. The circuit of claim 1, wherein the circuit is monolithically integrated.

22. A power amplifier module comprising the circuit of claim 1.

23. A method for limiting a high current through an amplifier operating between a varying supply voltage and a reference ground, the method comprising:
   controlling a current high limit to the amplifier based on a detected value of the varying supply voltage, such that for values of the varying supply voltage above a preset supply voltage limit, the current high limit decreases linearly with respect to increasing values of the varying supply voltage, and
   based on the controlling, providing a nearly constant value of a maximum power dissipated through the amplifier for the values of the varying supply voltage above a preset supply voltage limit.

24. A power amplifier circuit comprising:
   an amplifier configured to operate between a varying supply voltage and a reference ground;
   a bias circuit comprising an emitter-follower transistor configured to supply a bias signal to the amplifier based on a control current provided to a collector of the emitter-follower transistor; and
   a protection circuit configured to detect a level of the varying supply voltage and generate therefrom the control current having a control current high limit,
   wherein for a detected voltage of the varying supply voltage that is:
      i) lower than a preset supply voltage limit, the control current high limit is constant, and
      ii) higher than the preset supply voltage limit, the control current high limit is a function of the detected voltage having a negative slope with respect to increasing values of the detected voltage, and
      wherein the control current does not exceed the control current high limit.

25. The circuit of claim 1, wherein the control current high limit is a linear function of the detected voltage of the varying supply voltage.

26. The power amplifier circuit of claim 24, wherein the control current high limit is a linear function of the detected voltage.

* * * * *